United States Patent [19]

Wilson et al.

[11] 3,951,698

[45] Apr. 20, 1976

[54] DUAL USE OF EPITAXY SEED CRYSTAL AS TUBE INPUT WINDOW AND CATHODE STRUCTURE BASE

[75] Inventors: Herbert L. Wilson; William A. Gutierrez, both of Woodbridge, Va.

[73] Assignee: The United States of America as represented by the Secretary of the Army, Washington, D.C.

[22] Filed: Nov. 25, 1974

[21] Appl. No.: 527,181

[52] U.S. Cl. .............................. 148/33.4; 148/175; 313/94; 357/17

[51] Int. Cl.[2] .......................................... H01L 21/36

[58] Field of Search ............ 148/33.4, 175; 313/94, 313/102; 357/17

[56] References Cited

UNITED STATES PATENTS 3,696,262 10/1972 Antypas ........................ 148/33.4 X 3,699,401 10/1972 Tietjen et al. ............... 148/33.4 UX 3,752,713 8/1973 Sakuta et al. ............... 148/33.4 UX

*Primary Examiner*—L. Dewayne Rutledge

*Assistant Examiner*—J. M. Davis

*Attorney, Agent, or Firm*—Nathan Edelberg; Robert P. Gibson; Milton W. Lee

[57] ABSTRACT

A photon sensing device utilizing a III–V negative electron affinity photocathode grown on a window substrate support which simultaneously serves as a support and growth surface for the epitaxial growth of suitable cathode layers as well as the input window for the device.

7 Claims, 2 Drawing Figures

DUAL USE OF EPITAXY SEED CRYSTAL AS TUBE INPUT WINDOW AND CATHODE STRUCTURE BASE

The invention described herein may be manufactured, used, and licensed by or for the Government for governmental purposes without the payment to us of any royalty thereon.

BACKGROUND

This invention relates to photosensing devices and to a simplified method of incorporating a III–V negative electron affinity (NEA) photocathode into a photodetector tube structure. A single crystal and substrate, upon which the desired III–V photocathode layers are epitaxially grown, is used directly as the input window of the tube structure.

Negative electron affinity III–V materials comprise a family of new photocathodes with vastly improved performance over conventional S type photocathodes in terms of sensitivity and spectral range. Unlike S cathodes, which are deposited directly on the glass tube faceplate, these new photocathodes are epitaxially grown on relatively thick seed substrates and are independently incorporated into photo-tube structures, either by attaching them directly to the input glass faceplate or by mounting them separately in close proximity to the input faceplate. These types of "mounting" generally result in mechanical complexity and complications due to the specialized clips or holders required. In addition, if the photocathode is not in intimate contact with the window, severe optical problems are generally encountered. One solution to these problems lies in the use of the substrate, upon which the photocathode layers are grown, as the faceplate window of the device.

SUMMARY

Some of the advantages of the dual use of the substrate crystal as both the seed surface for the epitaxial growth of the cathode and as the input window of the phototube body lies in a reduction in tube fabrication steps, a reduction in interior tube surface area with less pumping surface, a reduction in optical problems resulting from multiple reflections that arise when the cathode is not in intimate contact with the faceplate, an intimate epitaxially formed bond between the window and interior photosurface for effecting cathode flatness, close temperature coefficients of expansion between components which eliminates possible strains and cracking of tube parts and an avoidance of trapped gas between the cathode structure and the faceplate which can occur when the cathode is clipped or sealed to a glass faceplate. Numerous uses are envisioned for the III–V negative electron affinity photocathodes and the technique for the fabrication thereof. In addition to their use in image intensifiers, they could be used in photomultipliers and photon converters and in areas such as specrophotometry, photography, optical communications, night vision equipment, etc.

DESCRIPTION OF PREFERRED EMBODIMENTS

Figure 1:
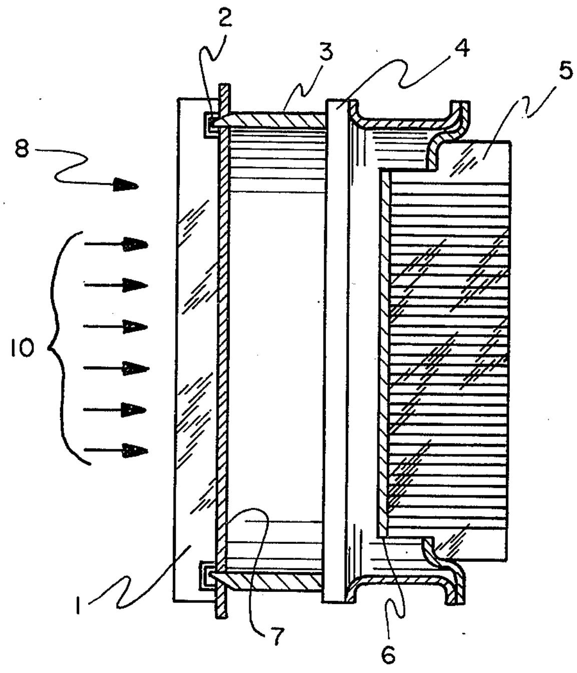
FIG. 1 represents a longitudinal cross-section of a wafer image intensifier tube utilizing a single crystal wafer as herein envisioned.

Referring now to the drawings, wherein like reference characters correspond to like elements in the two figures, there can be seen in FIG. 1 an image intensifier, 8, receptive to input radiation 10 impinging on the input window 1. A photocathode layer 7 is deposited directly onto the rear surface of the input window 1, and as the photocathode is irradiated, electrons are produced and multiplied by the microchannel plate 4. As the electrons exit from the microchannel plate, they strike the phosphor screen 6 and produce a visible image which is viewed through the fiber optic faceplate 5.

Figure 2:
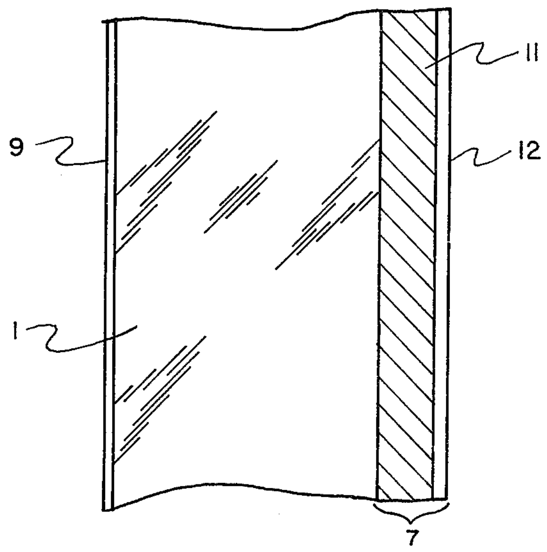
FIG. 2, more clearly illustrates the single crystal seed substrate with the associated cathode layers in accordance with this invention.

The crux of this invention, as shown in FIG. 2, lies in the fabrication of the photocathode layer directly onto the inside surface of a seed substrate wafer 1 which is also utilized as an input window for the image intensifier 8 of FIG. 1. The photocathode is applied to the seed substrate 1 by well known techniques, such as epitaxial growth, either vapor, liquid or a combination thereof. The seed crystal substrate is prepared by first applying a lattice matching layer 11 to the substrate prior to the growth of the photocathode layer 12.

There are material restrictions to be considered in choosing the single crystal wafer that can be used both as an input window and a seed substrate for the epitaxially grown cathode. The crystal wafer must have a temperature coefficient of expansion close to the tube wall material and to the epitaxial layers grown on its surface extending over a wide temperature range to include processing and operating temperatures. In addition the crystal wafer must have a lattice constant closely matching that of the epitaxial material grown. The crystal wafer must optically transmit over the spectral range desired for the cathode operation and must be sufficiently thick (10 mils or greater) and sufficiently strong to withstand sealing, temperature cycling, vacuum pressure and normal handling and must not leak or poison the tube operation by decomposition or chemical reaction.

One representative example of the window and epitaxially grown materials which have successfully been used is that of a gallium phosphide, GaP, single crystal wafer for the input window and seed substrate 1, having a thickness of 10 mils or greater, upon which is epitaxially grown a lattice matching layer 11 of gallium aluminum arsenide, GaAlAs, having a typical thickness falling within the range of 10 to 100 microns. A photoemissive layer 12 of gallium arsenide, GaAs, is then epitaxially grown on the lattice matching layer 11 to a thickness typically falling within the range of 0.5 to 3 microns. Other III–V materials may be utilized for the photoemissive layer depending upon the wavelength and band width of interest. For instance, gallium arsenide, GaAs, has a long wavelength threshold of 0.94 micron whereas gallium indium arsenide can be used to extend the long wavelength threshold to approximately 1.06 microns and either may be used as a matter of choice. The window substrate, lattice matching layer and photocathode layer are chosen for the appropriate spectral bandwidth and long wavelength detection threshold.

In order to reduce reflection at the input side of the tube a proper antireflection coating 9 is applied to the photon receiving side of the crystal substrate. Antireflection coatings are well known in the art and are not considered to constitute novelty in the instant case.

The input window 1 of the image intensifier 8 of FIG. 1 is sealed to the main tube wall 3 with indium. This is not considered to be a critical aspect of the invention, as the art of sealing faceplates to their mounting structure is an area of technology in itself and various acceptable sealing methods and materials are well known in the art. In the instant case, an indium seal functions most effectively and accomplishes the desired vacuum tight integrity.

The foregoing disclosure relates only to a preferred embodiment of the invention and numerous modifications may be made therein without departing from the spirit and scope of the invention as set forth in the appended claims.

We claim:

1. In a photon sensing device having an input faceplate window, a photocathode, an electron multiplier and an output viewing screen, the improvement consisting of an integrated input window and photocathode wherein the input faceplate window additionally serves as the substrate support upon which a layer of photocathode material is epitaxially grown.

2. The improvement as defined in claim 1, wherein the epitaxially grown photocathode materials are III–V negative electron affinity materials.

3. The improvement as defined in claim 2, wherein the input window is a single crystal seed substrate.

4. The improvement as defined in claim 3, wherein the single crystal seed substrate is gallium phosphide.

5. The improvement as defined in claim 3, wherein a III–V lattice matching layer is epitaxially grown onto the seed substrate in preparation for the growth of the III–V photocathode.

6. The improvement as defined in claim 5, wherein the seed crystal, lattice matching layer and photocathode layer are chosen for the appropriate spectral bandwidth and long wavelength detection threshold.

7. The improvement as defined in claim 6, wherein said seed crystal is gallium phosphide, said lattice matching layer is gallium aluminum arsenide and said photocathode material is selected from a group of III–V materials consisting of gallium arsenide and gallium indium arsenide.

* * * * *